United States Patent [19]
Akamine et al.

[11] Patent Number: 5,532,185
[45] Date of Patent: Jul. 2, 1996

[54] IMPURITY DOPING METHOD WITH ADSORBED DIFFUSION SOURCE

[75] Inventors: Tadao Akamine; Naoto Saito; Kenji Aoki, all of Tokyo, Japan

[73] Assignee: Seiko Instruments Inc., Tokyo, Japan

[21] Appl. No.: 858,173

[22] Filed: Mar. 27, 1992

[30] Foreign Application Priority Data

| Mar. 27, 1991 | [JP] | Japan | 3-063323 |
| May 17, 1991 | [JP] | Japan | 3-113544 |

[51] Int. Cl.⁶ .................................... H01L 21/385
[52] U.S. Cl. .................. 437/141; 437/146; 437/160; 437/162; 437/163; 437/164
[58] Field of Search .................. 437/141, 146, 437/160, 162, 163, 164

[56] References Cited

U.S. PATENT DOCUMENTS

| Re. 33,326 | 9/1990 | Ebata et al. | 118/697 |
| 3,458,367 | 7/1969 | Yasufuku | 29/576 |
| 3,506,508 | 4/1970 | Nickl | 117/201 |
| 3,540,950 | 11/1970 | Joseph | 29/578 |
| 3,576,685 | 4/1971 | Swann et al. | 437/160 |

(List continued on next page.)

FOREIGN PATENT DOCUMENTS

| 0233791 | 8/1987 | European Pat. Off. . | |
| 0259777 | 3/1988 | European Pat. Off. . | |
| 0268941 | 6/1988 | European Pat. Off. . | |
| 0322921 | 7/1989 | European Pat. Off. . | |
| 0413982 | 2/1991 | European Pat. Off. | 437/160 |
| 0417457 | 3/1991 | European Pat. Off. . | |
| 54-106180 | 8/1979 | Japan . | |
| 62-193178 | 8/1987 | Japan . | |
| 62-271475 | 11/1987 | Japan . | |
| 63-166219 | 7/1988 | Japan . | |
| 63-166220 | 7/1988 | Japan . | |
| 63-192266 | 8/1988 | Japan . | |
| 3-50743 | 3/1991 | Japan . | |
| 3-173421 | 7/1991 | Japan | 437/160 |
| 3-173423 | 7/1991 | Japan | 437/160 |
| 1384206 | 4/1982 | United Kingdom . | |
| 8201380 | 10/1981 | WIPO . | |
| WO8304342 | 12/1983 | WIPO . | |

OTHER PUBLICATIONS

"Method for Making Devices Having Field Gradients at Junction Edges"; Research Disclosure (1989) Jul., No. 303.
"A Stacked–Source–Drain MOSFET Using Selective Epitaxy"; Makino et al; 1046 B Extended Abstracts/Spring Meeting; 88–1 (1988) May 15–20 Princeton.
"Doping Reaction of $PH_3$ and $B_2H_6$ With Si(100)"; Yu et al.; 931 Jr. of App. Physics, 59 (1986) Jun., No. 12.
"A Metal–oxide–silicon field-effect transistor made by means of Solid–Phase doping"; Gong et al; 931 Jr of App. Physics; 65 (1989) 1 Jun., No. 11.
"Simple–Structured PMOSFET Fabricated Using Molecular Layer Doping"; Nishizawa et al; 1990 IEEE.
"Silicon Processing for the VLSI Era"; Wolfe et al; vol. 1—Process Technology.
"The Dielectric–Capped Self–Aligned Titanium Disilicide Process"; Tang et al; 1988 Symposium on VLSI Technology; May 10–13, 1988.
"VLSI Fabrication Principles"; Ghandhi; Rensselaer Polytechnic Institute pp. 140–177, 214–216, 231–235.
"Nikkei High Tech Report"; vol. 4, No. 7, Feb. 13, 1989.
Leung, D. L., et al., "CMOS Devices Fabricated in Thin Epitaxial Silicon on Oxide", 1989 IEEE SOS/SOI Technology Conference Oct., 1989, pp. 74–75.

Primary Examiner—R. Bruce Breneman
Attorney, Agent, or Firm—Loeb & Loeb

[57] ABSTRACT

The surface of a silicon wafer is cleaned to expose chemically active surface. Diborane gas is fed to the exposed active surface for adsorbing boron to the active surface. The adsorbed boron on the silicon wafer works as an impurity diffusion source. Boron is diffused from the impurity diffusion source into the silicon wafer to make an impurity diffusion layer by heat treatment. The amount of diborane gas fed to the active surface is set in an amount at which the sheet resistance of the impurity diffusion layer does not depend on variations in feed amount.

10 Claims, 11 Drawing Sheets

U.S. PATENT DOCUMENTS

| | | | |
|---|---|---|---|
| 3,888,706 | 6/1975 | Dingwall | 148/187 |
| 3,966,515 | 6/1976 | Guthrie | 437/160 |
| 4,100,310 | 7/1978 | Ura et al. | 427/8 |
| 4,151,008 | 4/1979 | Kirkpatrick | 148/1.5 |
| 4,213,807 | 7/1980 | Rosnowski | 437/160 |
| 4,224,088 | 9/1980 | Komatsu et al. | 437/160 |
| 4,242,691 | 12/1980 | Kotani et al. | 257/327 |
| 4,279,671 | 7/1981 | Komatsu | 148/188 |
| 4,381,202 | 4/1983 | Mori et al. | 148/1.5 |
| 4,382,099 | 5/1983 | Legge et al. | 437/160 |
| 4,395,433 | 7/1983 | Nagakubo et al. | 427/35 |
| 4,441,932 | 4/1984 | Akasaka et al. | 437/31 |
| 4,465,529 | 8/1984 | Arima et al. | 148/188 |
| 4,475,279 | 10/1984 | Gahle | 29/577 C |
| 4,503,598 | 3/1985 | Vora et al. | 29/571 |
| 4,569,701 | 2/1986 | Oh | 437/78 |
| 4,626,450 | 12/1986 | Tani et al. | 427/93 |
| 4,677,736 | 7/1987 | Brown | 437/41 |
| 4,697,198 | 9/1987 | Komori et al. | 257/345 |
| 4,737,471 | 4/1988 | Shirato et al. | 437/44 |
| 4,784,968 | 11/1988 | Komori et al. | 437/41 |
| 4,789,644 | 12/1988 | Meda | 437/41 |
| 4,791,074 | 12/1988 | Tsunashima et al. | 437/160 |
| 4,855,258 | 8/1989 | Allman et al. | 437/241 |
| 4,861,729 | 8/1989 | Fuse et al. | 437/18 |
| 4,868,135 | 9/1989 | Ogura et al. | 437/31 |
| 4,879,255 | 11/1989 | Deguchi et al. | 437/59 |
| 4,891,326 | 1/1990 | Koyanagi | 437/29 |
| 4,907,048 | 3/1990 | Huang | 257/344 |
| 4,912,061 | 3/1990 | Nasr | 437/44 |
| 4,912,065 | 3/1990 | Mizuno et al. | 437/141 |
| 4,914,492 | 4/1990 | Matsumoto | 257/345 |
| 4,931,411 | 6/1990 | Tigelaar et al. | 437/192 |
| 4,933,994 | 6/1990 | Orban | 437/44 |
| 4,937,205 | 6/1990 | Nakayama et al. | 437/165 |
| 4,939,103 | 7/1990 | Szolgyemy | 437/151 |
| 4,940,505 | 7/1990 | Schachameyer et al. | 117/97 |
| 4,948,744 | 8/1990 | Kita | 437/44 |
| 4,962,726 | 10/1990 | Matsushita et al. | 437/192 |
| 4,966,861 | 10/1990 | Mieno et al. | 437/99 |
| 4,968,639 | 11/1990 | Bergonzoni | 437/57 |
| 4,996,168 | 2/1991 | Ozaki et al. | 437/164 |
| 5,011,789 | 4/1991 | Burns | 117/90 |

IMPURITY DOPING METHOD WITH ADSORBED DIFFUSION SOURCE

BACKGROUND OF THE INVENTION

The present invention relates to a doping method to form a region having a desired conductivity type and resistivity in a substrate as part of a process of manufacturing a semiconductor device such as a bipolar transistor or insulated-gate field effect transistor.

One of the conventional typical doping methods is the ion implantation method. In addition, there is another method in which a gaseous impurity element or a compound gas containing the impurity element is applied to a semiconductor surface to form a layer of the impurity element or a layer containing the impurity element on the semiconductor surface before the impurity is diffused into the semiconductor or it is activated by using the formed layer as a diffusion source. Especially, J. Nishizawa et al. Appl. Phys. Lett., 56, 14, P.1334 (1990), "Ultrashallow high doping of boron using molecular layer doping" proposes a molecular layer doping method (hereafter referred to as MLD method) for doping with an impurity capable of forming a very shallow junction and free from shadow effect and physical damage.

However, the conventional ion implantation method has various drawbacks due to its inherent nature as follows:

(i) Damage may be caused on a sample surface due to kinetic energy of impurity ions to be implanted.

(ii) Since the implanted impurity atoms are distributed in a normal distribution having a variance determined by their acceleration energy, it is impossible to form a steep density profile in a deep section.

(iii) With microminiaturation of the semiconductor device, asymmetricity of the device characteristics may be caused due to shadow effects.

(iv) It is not easy to form a shallow junction as channeling would be caused.

(v) If ion implantation is carried out with a reduced acceleration voltage of the impurity ion in order to form a shallow junction, the degree of convergence of the ion beam is degradated, resulting in reduction of production throughput.

In the conventional MLD method, it is easy to form a very shallow junction. However, it is difficult to uniformly dope a plurality of wafers, as described below. FIGS. 2 are process-flow sectional views showing successive stages in a method for doping a plurality of semiconductor wafers with an impurity according to the conventional MLD method. FIG. 2(a) shows the stage of cleaning the surface of semiconductor wafers 1. FIG. 2(b) shows the stage in which a gaseous impurity element 12 or compound gas 12 containing the impurity element is applied to the surface of semiconductor wafers 1 to form an adsorbed layer 13 as a diffusion source of the impurity element or a layer 13 containing the impurity element. Because the feed amount of the gaseous impurity element 12 or the compound gas 12 containing the impurity element depends on the position, or location, at which the wafer is disposed in this process, the thickness and the impurity concentration of the adsorbed layer 13 of the impurity element or the adsorbed layer 13 containing the impurity element is not uniformly formed on the wafers. The thickness and/or the impurity concentration of the adsorbed layer 13 differs from one wafer to another.

FIG. 2(c) shows process stage for diffusing the impurity from the adsorbed layer 13 into the semiconductor wafers 1 and activating the diffused impurity. An impurity diffusion layer 14 is not uniformly formed because its thickness and/or impurity concentration corresponds to the thickness and/or the impurity concentration of the layer 13 of the impurity element or the layer 13 containing the impurity element formed in FIG. 2(b).

As described above, it is difficult to uniformly dope impurity into many wafers by this conventional method.

SUMMARY OF THE INVENTION

An object of the invention is to provide a new impurity doping method effective to form an extremely shallow junction without causing damage to the semiconductor surface or reduction of production throughput.

Another object of the invention is to provide a new impurity doping method to give impurity diffusion layers a uniform concentration distribution in many semiconductor wafers.

In order to achieve the above noted object, according to the invention, the pressure, feed time, and/or amount of gaseous impurity element or compound gas containing the impurity element to be fed to semiconductor surface is set to a range in which the sheet resistance of the doped semiconductor surface will not greatly depend on the pressure, feed time, or amount of the gaseous impurity element or compound gas containing the impurity element. Further, the pressure, feed time, or amount of the gaseous impurity element or compound gas containing the impurity element, and the diffusion temperature and diffusion time are set so that an impurity diffusion source containing an impurity at the solid solubility or more remains on the semiconductor surface until the time after the process for diffusion and activation of the impurity. Solid solubility means the maximum concentration of impurity which a Si lattice can accept in a solid solution of the lattice and the impurity; if additional impurity is provided, it will not enter into the solid solution.

The above method facilitates making the thickness and impurity concentration of the impurity element layer or the layer containing the impurity element formed on the semiconductor surface uniform, corresponding to the feed amount of the gaseous impurity element or of the compound gas containing the impurity element in many wafers and the same wafer surface. Moreover, even if the thickness and impurity concentration of the layer differ between wafers or on the same wafer surface, it is possible to make uniform the doping amount and the depth-directional distribution of impurity concentration because the impurity concentration at the interface between the impurity diffusion source and the semiconductor is kept constant while diffusion is effected in the subsequent process.

DESCRIPTION OF THE PREFERRED EMBODIMENTS

Hereinafter, embodiments of the inventive impurity doping method will be described in detail with reference to FIGS. 1–12(d).

Figure 1:
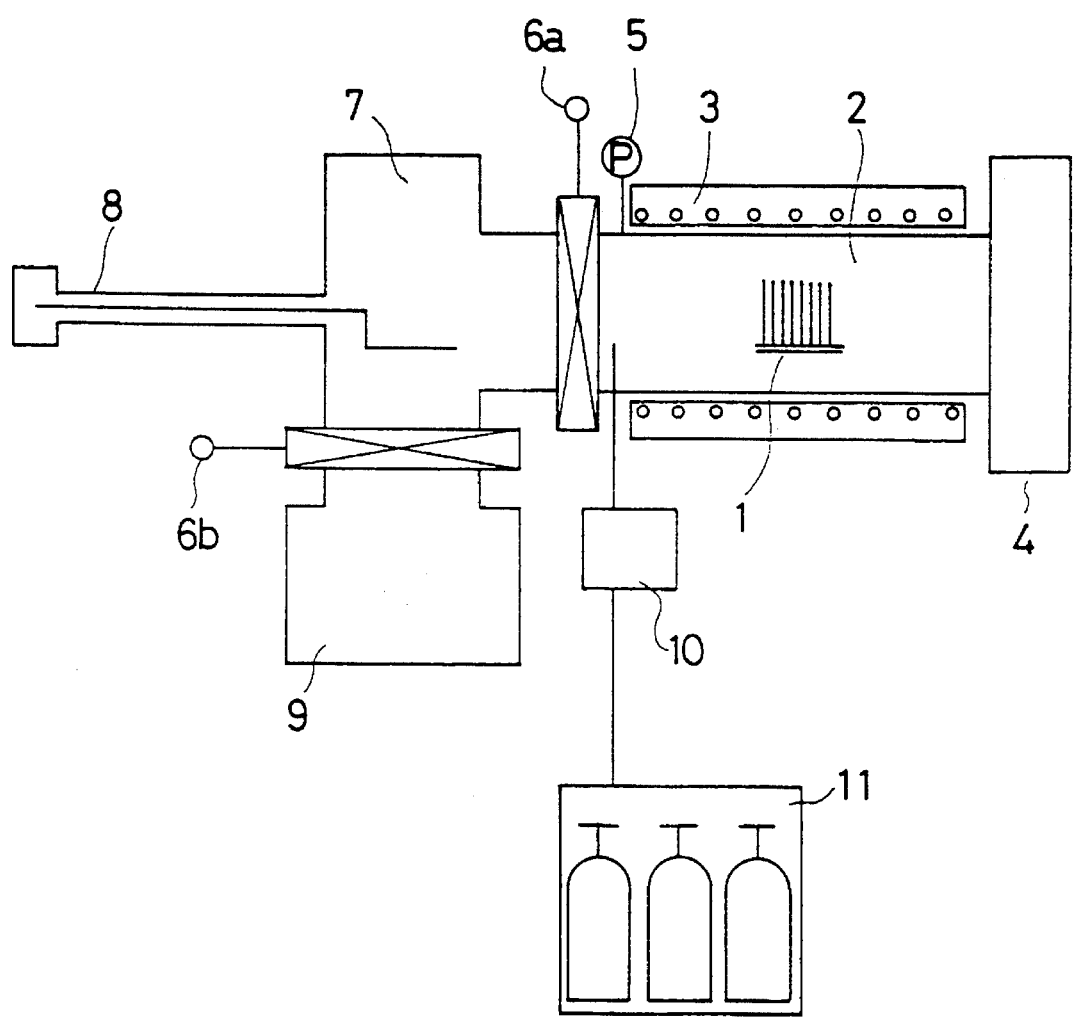
FIG. 1 is a block diagram of the apparatus used to perform processes according to the present invention.
Figure 2A:
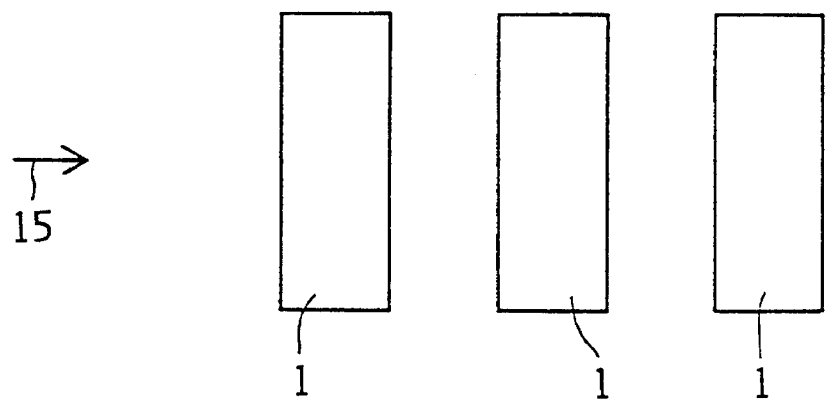
FIGS. 2(a)–2(c) are step-sequence sectional views showing the method for doping a plurality of semiconductor wafers with an impurity according to the conventional MLD method.
Figure 2B:
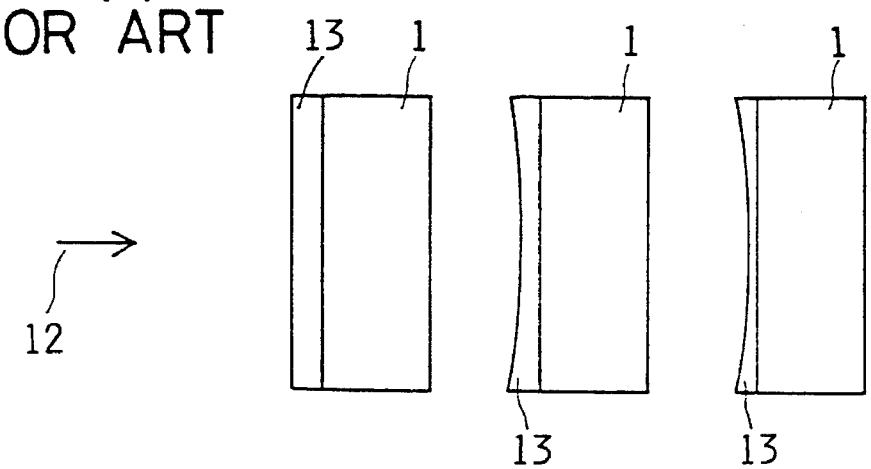
Figure 2C:
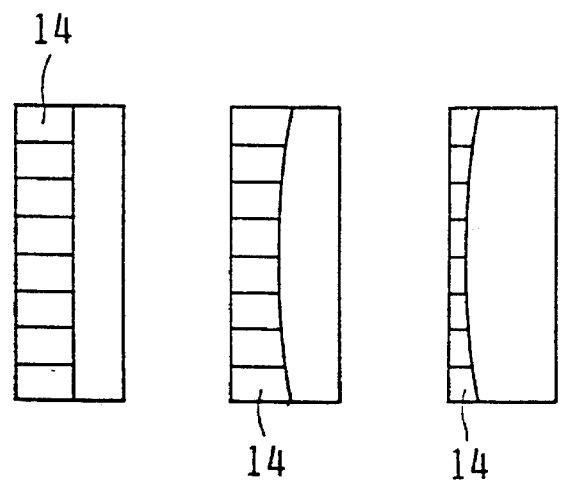

FIG. 1 is a schematic diagram of an apparatus used in practicing the invention. In FIG. 1, a silicon substrate 1 is set in the center of a chamber 2 made of quartz. The temperature of substrate 1 is maintained at a given value by controlling a heating system 3 utilizing infrared ray lamp heating or resistance heating. The interior of chamber 2 is evacuated to a high vacuum degree by means of a high vacuum evacuation system 4 composed of a plurality of pumps including a main vacuum pump in the form of a turbo-molecular pump. Degree of vacuum inside the chamber 2 is monitored by a pressure gage 5.

The silicon substrate 1 is transported by means of a transportation mechanism 8 between the chamber 2 and a loading chamber 7 which communicates with the main chamber 2 through a gate valve 6a which is held open during transportation of substrate 1 between chambers 2 and 7. The loading chamber 7 is normally evacuated at high vacuum by means of a loading chamber evacuation system 9 which is placed in communication with chamber 7 by another gate valve 6b which is open except during the course of loading of the silicon substrate 1 into the loading chamber 7 and during transportation of substrate 1. A gas supply source 11 introduces various gases into the chamber 2. A gas feeding control system 10 is used to control the feed amount of gas and the feeding mode etc.

Figure 3A:
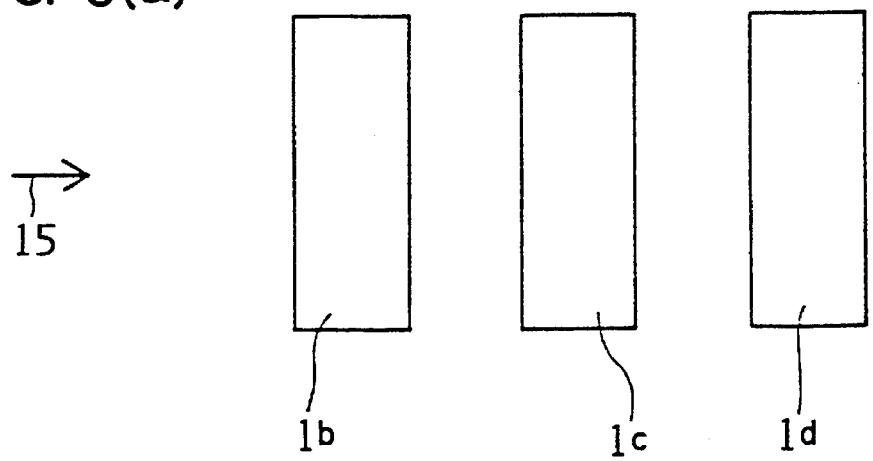
FIGS. 3(a)–3(c) are step-sequence sectional views showing the doping method according to a first embodiment of the present invention.
Figure 3B:
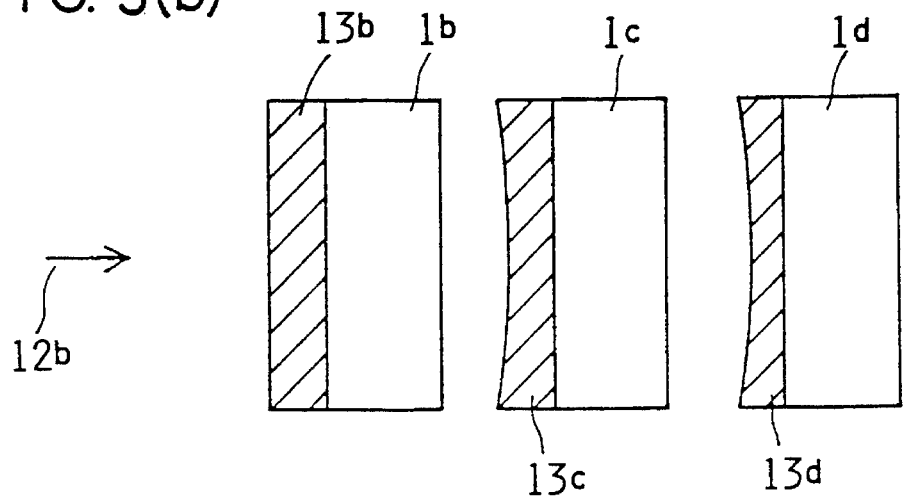
Figure 3C:
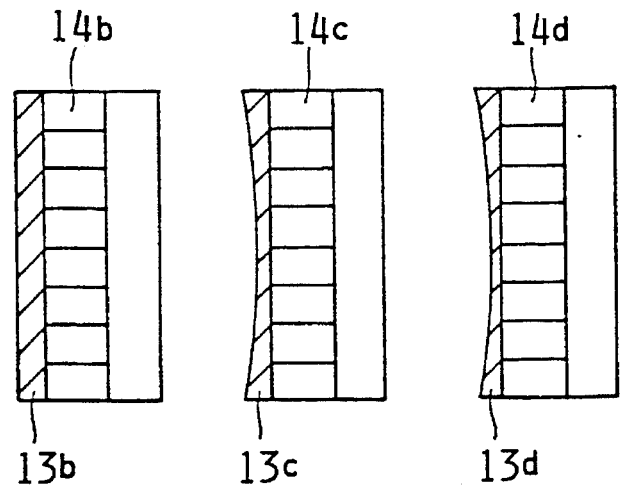

FIGS. 3(a) through 3(c) show the successive steps of a first embodiment of the method for doping according to the present invention. The embodiment is described for batch processing to dope silicon semiconductor with boron, which is a P-type impurity. Doping with the impurity is executed in the apparatus shown in FIG. 1.

For single wafer processing, only the first wafer of the batch in this embodiment is considered.

FIG. 3(a) relates to the step of cleaning the surface of silicon wafers 1b, 1c, 1d. The silicon wafers are set in the center of vacuum chamber 2 which is held at a background or base pressure of less than $1.3 \times 10^{-6}$ Torr. While setting the substrate temperature, for example, at 800° C., hydrogen gas 15 is introduced for a predetermined time interval to boost pressure inside the chamber, for example, up to $1.6 \times 10^{-4}$ Torr. By this treatment, any inert film in the form of a natural oxide film is removed from the surface of the silicon substrates 1b, 1c, 1d so as to expose chemically active silicon surfaces.

Other methods for cleaning the surface of a silicon wafer include: heating the silicon wafer surface to a temperature of 1,100° C. or higher under normal pressure; heating it to a temperature of 1,000° C. or higher under a pressure of 1 Torr; heating it to a temperature of 600° C. or higher under a pressure of $1.3 \times 10^{-6}$ Torr; and feeding chlorine or fluorine gas to the silicon wafer surface. These methods can also be used in the process of the present invention.

In the step of FIG. 3(b), layers 13b, 13c, 13d of boron or a compound containing boron are formed on the surface of silicon substrates 1b, 1c and 1d. After cleaning of the surface in the FIG. 3(a) step, charging of hydrogen gas is stopped and the substrate temperature is set, for example, at 800° C. After reaching stably the set temperature, boron-containing compound gas 12b in the form of 5% diborane (5%$B_2H_2$) is applied to the surfaces of silicon substrates 1b, 1c, 1d for a given time interval, for example 200 seconds, to fill the chamber, for example at a pressure of $1 \times 10^{-3}$ Torr, to thereby form the layers 13b, 13c, 13d of boron or boron-containing compound. In this process, the feed amount of the gaseous impurity element or compound gas 12b containing the impurity element differs depending on the position of each wafer. As shown in FIG. 3(b), the layer 13b with an impurity concentration higher than the solid solubility is formed most thickly on silicon wafer 1b located at the most upstream side of the gas flow in the batch. The layer 13c with an impurity concentration higher than the solid solubility is lightly thinly formed entirely on the silicon wafer 1c located at the middle of the batch and more thinly formed at the center of wafer 1c than at the edges thereof. The layer 13d with an impurity concentration higher than the solid solubility is most thinly formed on the silicon wafer 1d located at the most downstream side of the gas flow in the batch and is more thinly formed at the center of wafer 1d than at the edges thereof.

When the feed amount of the gaseous impurity element or compound gas 12b is adequately increased, the thickness of the layers 13b through 13d increases and also the thickness and impurity concentration of the layers 13b through 13d become further uniform because the reaction on the wafer surface approaches from the feed rate determination to the reaction rate determination.

It is possible to use any compound gas containing an impurity element such as arsine ($AsH_3$), phosphine ($PH_3$), or stibine ($SbH_3$) as well as diborane for the gaseous impurity element or compound gas used for the process in FIG. 3(b). The diluent gas can use any one of hydrogen, helium, argon, and neon as well as nitrogen.

The temperature of semiconductor wafers when gas is fed should be kept within the range in which a layer of an impurity element or layer containing the impurity element can be formed by reacting on the semiconductor wafer surface. When diborane is used, for example, the temperature should range between 200° and 1,400° C.

FIG. 3(c) shows the process for diffusing boron from the layers 13b, 13c, 13d into silicon wafers 1b, 1c, 1d and activating boron to form boron diffusion layers 14b, 14c, 14d. When silicon wafers 1b, 1c, 1d are heat-treated in a nitrogen atmosphere for 60 minutes at different temperatures, for example, uniform doping is achieved, accompanied by different sheet resistance values: 230 Ω/□ at 850° C., 100 Ω/□ (with a peak concentration of boron of $1 \times 10^{20}$ $cm^{-3}$ and a junction depth of 3,000 Å) at 900° C., and 50 Ω/□ at 950° C. Shallower junctions with higher concentration can be formed by rapid thermal annealing.

In the process step of FIG. 3(c), layers 13b through 13d with the impurity concentration higher than the solid solubility are formed on the surface of every semiconductor wafer 1 so that the layers 13b through 13d of the solid solubility or more remain on the surface of every semiconductor wafer 1 until the end of the heat treatment process in FIG. 3(c) and the impurity concentration of the layers is maintained at a level higher than the solid solubility of the semiconductor wafer at the heat treatment temperature. Thus, the impurity is sufficiently fed, or diffused, from the layers 13b through 13d to the semiconductor wafer 1 in the process step of FIG. 3(c) even if the concentration or thickness of the layers 13b through 13d formed in the process step of FIG. 3(b) varies. Therefore, the impurity concentration at the interface between the layers 13b through 13d and the impurity diffusion layers 14b through 14d is kept at a certain value determined by the temperature of the heat treatment process as shown in FIG. 8.

Furthermore, the impurity concentration distribution of the impurity diffusion layers 14b through 14d becomes uniform in the depth direction independently of the wafer position in the batch and the in-plane position of each wafer. That is, the peak concentration of impurity can be controlled by the diffusion temperature and the junction depth can be controlled by the diffusion time and diffusion temperature.

Figure 7:
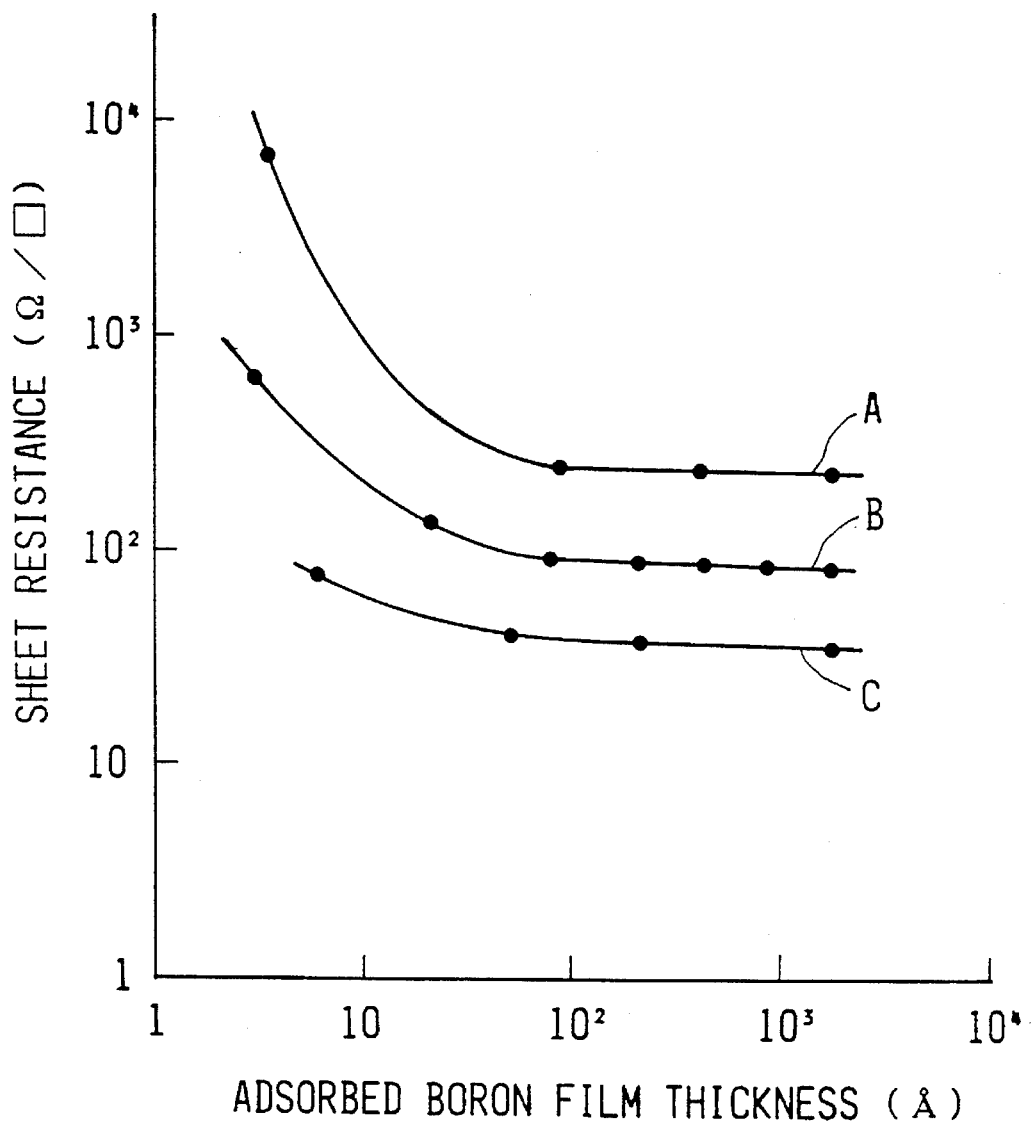
FIG. 7 is a diagram showing the desorbed boron film thickness dependency of the sheet resistance of the silicon wafer.

FIG. 7 shows the relation between the film thickness of deposited boron formed in the step of FIG. 3(b) and the sheet resistance of the doped region after the step of FIG. 3(c), after doping by steps similar to those described above with reference to FIGS. 3(a) through 3(c). The step of FIG. 3(b) is performed at 600° C., and the step of FIG. 3(c) is performed on three different batches at respective temperatures of 850° C., 900° C. and 950° C., each for 1 hour. Line A shows the sheet resistance in case the heat treatment in the process of diffusion is performed at 850° C. for 1 hour. Line B shows the sheet resistance in case the heat treatment in the process of diffusion is performed at 900° C. for 1 hour. Line C shows the sheet resistance in case the heat treatment in the process of diffusion is performed at 950° C. for 1 hour. When the film thickness of deposited boron is at least approx. 100 Å, the sheet resistance is almost uniform. Therefore, even if variation of the film thickness cannot be prevented when depositing the boron, the film thickness of boron should be at least approx. 100 Å so that the sheet resistance will be uniform. The lower the sheet resistance, the thicker the boron film necessary for producing a uniform sheet resistance. The higher the sheet resistance, the thinner the boron film needed for achieving this result.

Figure 8:
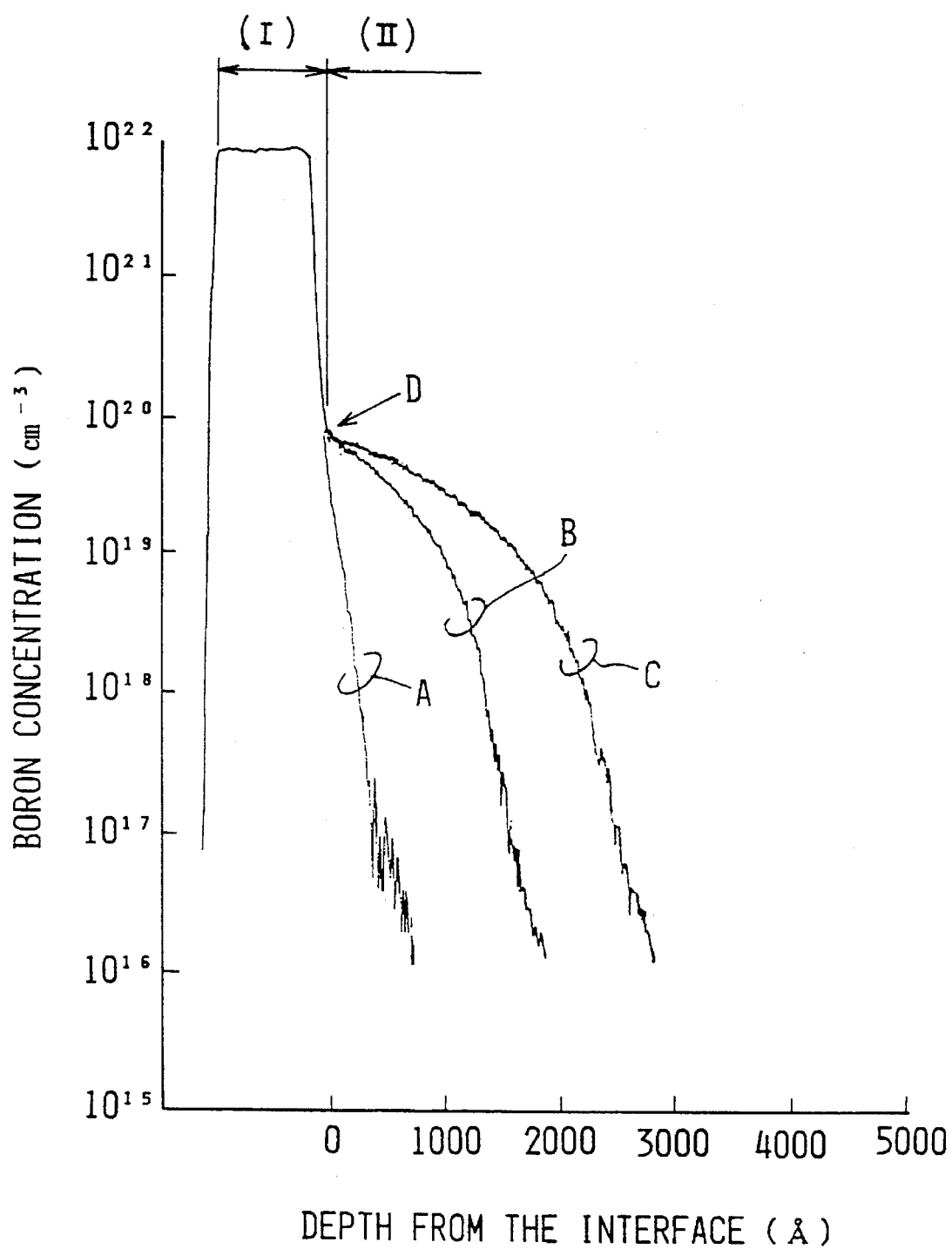
FIG. 8 is a diagram showing the change of the concentration distribution of an impurity element in the depth direction according to heat treatment time.

FIG. 8 shows the change of the concentration distribution of an impurity element in the depth direction according to the heat treatment time. Referring again to FIG. 3(b), diborane 12b is fed to the surface of a silicon wafer to form the impurity diffusion source at the wafer temperature of 800° C. The feed amount of diborane expressed as the product of the partial pressure and feed time of diborane comes to $5 \times 10^{-3}$ Torr. sec. And then, the impurity is diffused from the impurity diffusion source into semiconductor wafer and is activated at 900° C. to form an impurity diffusion layer. In FIG. 8, an area (I) shows the impurity diffusion source with the impurity concentration higher than the solid solubility at the diffusion temperature. Another area (II) shows the impurity diffusion layer in the semiconductor substrate. A point D shows the solid solubility of boron in the Si substrate at 900° C. It is found that only the diffusion depth can be increased as the diffusion time increases while the impurity concentration at the interface between the impurity diffusion source with an impurity concentration higher than the solid solubility at the diffusion temperature and the impurity diffusion layer is kept constant independently of the diffusion time. For example, the line A shows the impurity concentration distribution without a diffusion process, the line B shows that the diffusion depth reaches approx. 2,000 Å after a heat treatment for 10 min at 900° C. and the line C shows that the diffusion depth reaches approx. 3,000 Å after a heat treatment for 60 min at 900° C. However, the impurity concentration at the interface between the impurity diffusion source and the impurity diffusion layer is continuously kept at $8 \times 10^{19}$ $cm^{-3}$ independently of the diffusion time.

When the feed amount of diborane is increased to $5 \times 10^{-3}$ Torr. sec or more and diffusion is executed under the same conditions, the thickness and impurity concentration of the impurity diffusion source with an impurity concentration higher than the solid solubility increase but the impurity distribution of the diffusion layer hardly changes. Therefore, for the doping with boron by single-wafer processing or batch processing, the impurity distribution of the diffusion layer becomes constant in the wafer plane and in the batch on the condition that the feed amount of diborane comes to $5 \times 10^{-3}$ Torr. sec or more on the surface of every semiconductor wafer. Then, by removing the impurity diffusion source which remains on the semiconductor substrate, uniform doping is realized.

Figure 9:
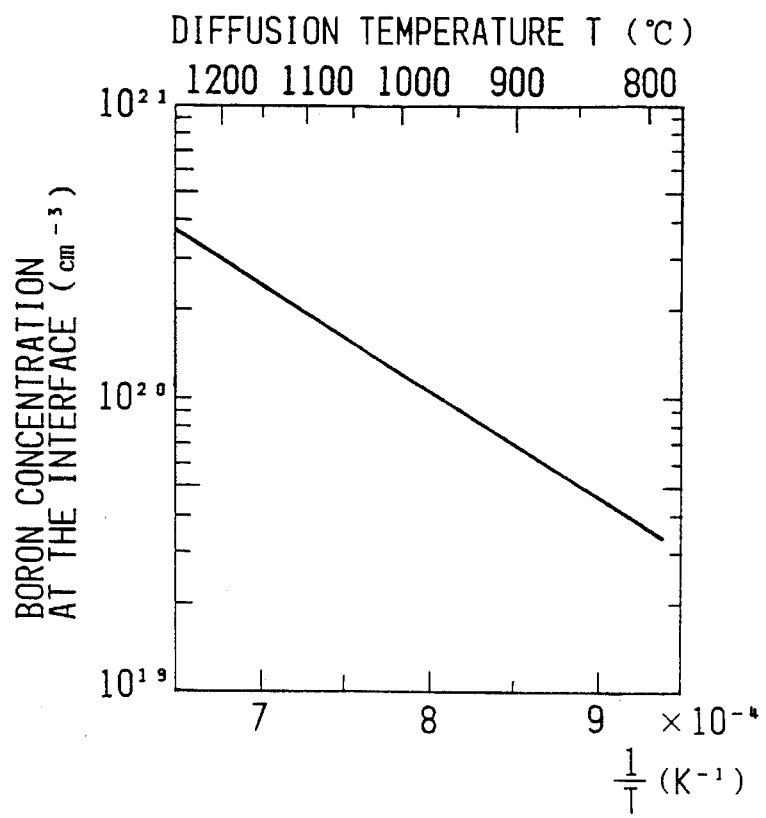
FIG. 9 is a diagram showing the diffusion temperature dependency of the impurity concentration at the interface between an impurity diffusion layer and an impurity diffusion source containing the impurity element of the solid solubility or more at the diffusion temperature.

FIG. 9 shows the diffusion temperature dependency of the impurity concentration at the interface between the impurity diffusion layer and the impurity diffusion source with the impurity concentration higher than the solid solubility at the diffusion temperature. Diborane is fed to the surface of a silicon wafer at the wafer temperature of 800° C. The feed amount of diborane comes to $5 \times 10^{-3}$ Torr. sec or more. The impurity is diffused from the impurity diffusion source into the semiconductor wafer and is activated at a temperature between 800° and 1,200° C. to form an impurity diffusion layer. From FIG. 9, it is found that the impurity concentration at the interface can be controlled in accordance with the diffusion temperature. For example, the impurity concentration comes to $3.5 \times 10^{19}$ $cm^{-3}$ for the heat treatment at 800° C. and $3.0 \times 10^{20}$ $cm^{-3}$ for the heat treatment at 1,200° C. Therefore, by selecting a diffusion temperature within the range of 800° to 1,200° C., the concentration can simply be controlled between $2.5 \times 10^{19}$ $cm^{-3}$ and $3.0 \times 10^{20}$ $cm^{-3}$ in accordance with the selected temperature. The diffusion depth can be increased by increasing the diffusion time. When the feed amount of diborane is increased to $5 \times 10^{-3}$ Torr. sec or more before diffusion is executed under the same conditions, the thickness and impurity concentration of the impurity diffusion source increase but the impurity distribution of the diffusion layer hardly changes.

Therefore, for doping with boron by single-wafer processing or batch processing, the impurity distribution of the diffusion layer becomes constant in the wafer plane and in the batch on the condition that the feed amount of diborane comes to $5 \times 10^{-3}$ Torr. sec or more on the surface of every semiconductor wafer where an impurity diffusion layer is formed. Then, by removing the impurity diffusion source which remains on the semiconductor substrate, uniform doping is realized.

However, if diborane is fed to the semiconductor surface on the condition that the feed amount thereof comes to $5 \times 10^{-3}$ Torr. sec or less, the impurity concentration at the interface not only comes to a value lower than that in FIG. 9 but does not become constant because the concentration depends on the feed amount of diborane.

As described above, doping can be controlled at a certain impurity concentration by increasing the feed amount of diborane to $5 \times 10^{-3}$ Torr. sec or more. In this case, further uniform doping is realized by setting the temperature in the process for diffusion or activation to a value 100° C. or more above the temperature when diborane is fed because the amount of impurity diffused in feeding diborane can be decreased compared with the amount of impurity diffused in the process for diffusion or activation.

Figure 10:
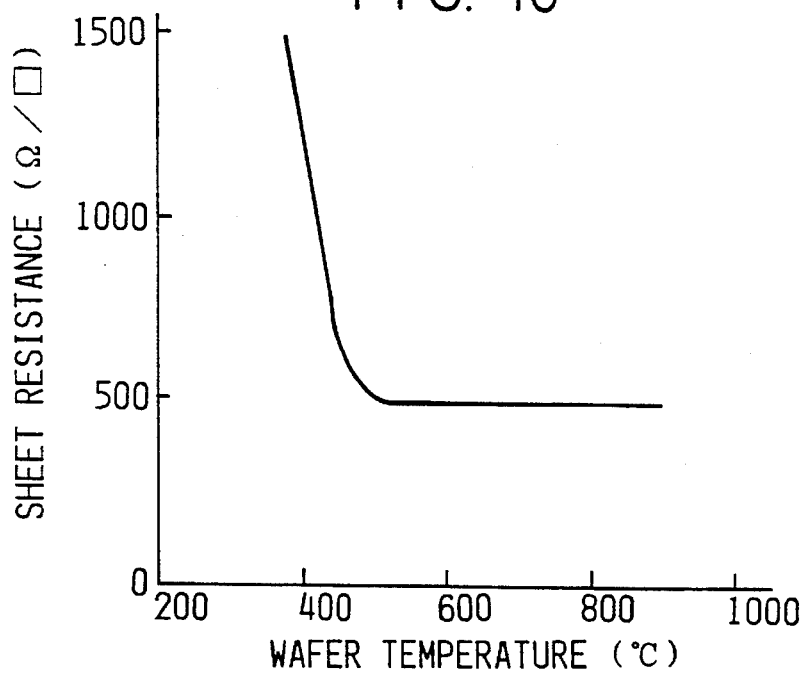
FIG. 10, is a diagram showing the wafer temperature dependency of sheet resistance when diborane is fed.

FIG. 10 shows the change of the sheet resistance of the impurity diffusion layer with wafer temperature when diborane is fed to the surface of a silicon wafer at the wafer temperature of 300° to 900° C. The feed amount of diborane comes to $7 \times 10^{-4}$ Torr. sec to form a layer of the impurity diffusion source with the impurity concentration higher than the solid solubility. The impurity is diffused from the impurity diffusion source into the semiconductor wafer and it is activated at 950° C. for 1 hr to form the impurity diffusion layer. From FIG. 10, it is found that the sheet resistance is kept at approx. 500 $\Omega/\square$ at the wafer temperature of 500° to 900° C. when diborane is fed. Therefore, uniform doping with boron is realized by setting the wafer temperature to 500° to 900° C. when diborane is fed.

The following method may be employed to form the impurity diffusion sources 13b, 13c, 13d which are thick enough and have adequately-high impurity concentration on the surface of the semiconductor wafers 1b, 1c, 1d in the process in FIG. 3(b).

Figure 4:
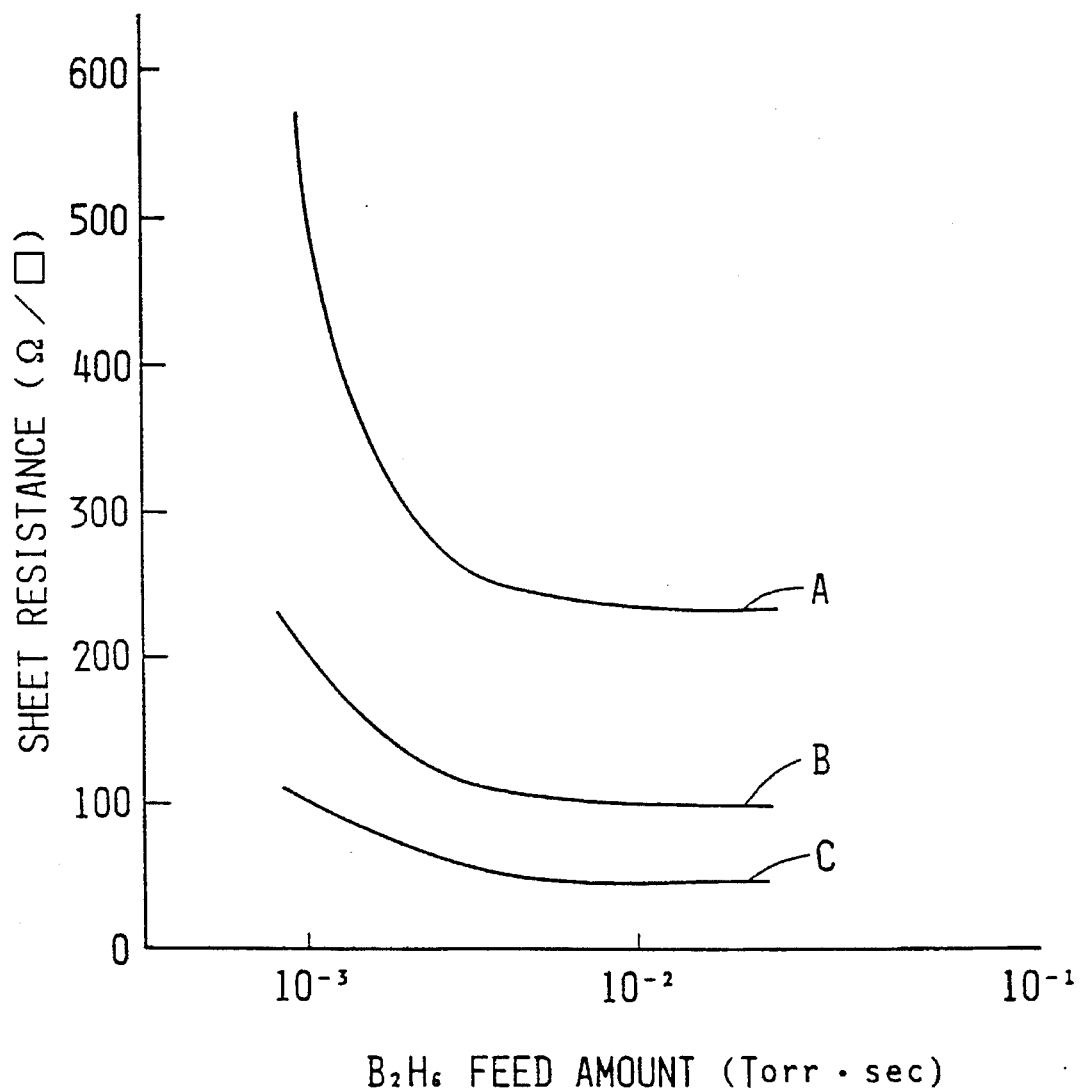
FIG. 4 is a diagram showing the diborane feed-amount dependency of the sheet resistance of a silicon wafer.

FIG. 4 shows the diborane feed-amount dependency and the diffusion temperature dependency of the sheet resistance of the impurity diffusion layer after passing through the process for diffusing boron into the silicon wafer and activating boron. Line A shows the sheet resistance in case the heat treatment in the process of diffusion is performed at 850° C. for 1 hour. Line B shows the sheet resistance in case the heat treatment in the process of diffusion is performed at 900° C. for 1 hour. Line C shows the sheet resistance in case the heat treatment in the process of diffusion is performed at 950° C. for 1 hour. The silicon wafer is doped with boron under the same conditions as those of the embodiment of FIGS. 3 except for the feed amount of gas and the diffusion temperature of boron. The feed amount of diborane described here is the product of the pressure of the diborane in the apparatus and the feed time of diborane but the feed amount of nitrogen used for dilution is not included. For example, the feed amount of diborane ($B_2H_6$) for the embodiment in FIG. 3 is $1 \times 10^{-2}$ Torr. sec. FIG. 4 shows that the ratio of the change of the sheet resistance of the impurity diffusion layer to the change of the feed amount of diborane increases in the area having a small feed amount of gas and decreases in the area having a large feed amount of gas from the line showing the feed amount of diborane of approx. $4 \times 10^{-3}$ Torr. sec. It is found that above that feed amount value, there is an area where the sheet resistance hardly depends on the feed amount of gas. Therefore, uniform doping is realized by setting the feed amount of diborane to $4 \times 10^{-3}$ Torr. sec or more in the process for feeding diborane which is an impurity compound gas to the surface of the silicon wafer in FIG. 3(b) to form a layer of boron or a layer containing boron. Because the feed amount of diborane described above is a measured value obtained at a location close to the vacuum gauge of the apparatus, it may not accurately coincide with the incoming amount of diborane at the surface of a silicon wafer to be doped. Therefore, because the range of values for the feed amount of diborane capable for uniform doping depends on the shape of the apparatus, the positional relationship between the gas inlet and wafer, the silicon wafer arrangement system, and the size of the silicon wafer, it is possible to accurately set the feed amount of diborane by checking the diborane feed-amount dependency of sheet resistance with an apparatus actually used for doping.

Figure 5:
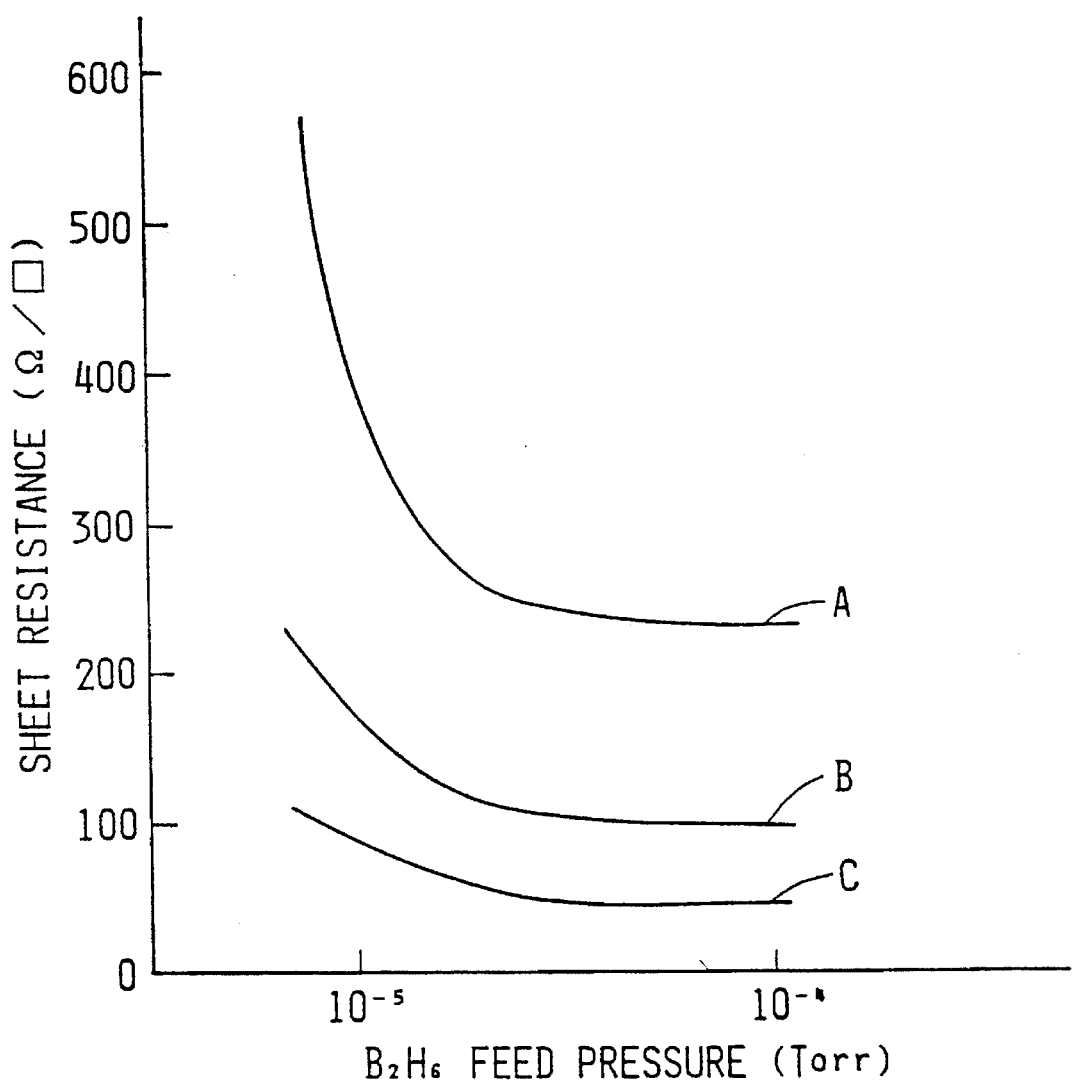
FIG. 5 is a diagram showing the diborane feed-pressure dependency of the sheet resistance of the silicon wafer.

FIG. 5 shows the diborane feed pressure dependency and the diffusion temperature dependency of the sheet resistance of the impurity diffusion layer after passing through the process for diffusing boron into the silicon wafer and activating boron. Line A shows the sheet resistance in case the heat treatment in the process of diffusion is performed at 850° C. for 1 hour. Line B shows the sheet resistance in case the heat treatment in the process of diffusion is performed at 900° C. for 1 hour. Line C shows the sheet resistance in case the heat treatment in the process of diffusion is performed at 950° C. for 1 hour. The silicon wafer is doped with boron under the same conditions as those of the embodiment of FIGS. 3 except for the gas feed pressure and the boron diffusion temperature. The diborane feed pressure described here is the pressure of diborane in the apparatus but the pressure of nitrogen used for dilution is not included. For example, the diborane feed pressure for the embodiment in FIGS. 3 is $5 \times 10^{-5}$ Torr. FIG. 5 shows that the ratio of the change of the sheet resistance of the impurity diffusion layer to the change of the feed pressure of diborane increases in the area having a low feed pressure of gas and decreases in the area having a high feed pressure of gas from the line showing the feed pressure of diborane of approx. $2 \times 10^{-5}$ Torr. It is found that there is an area where the sheet resistance hardly depends on the feed pressure of gas. Therefore, uniform doping is realized by setting the feed pressure of diborane to $2 \times 10^{-5}$ Torr or more in the process for feeding diborane which is an impurity compound gas to the surface of the silicon wafer in FIG. 3(b) to form a layer of boron or a layer containing boron.

Figure 6:
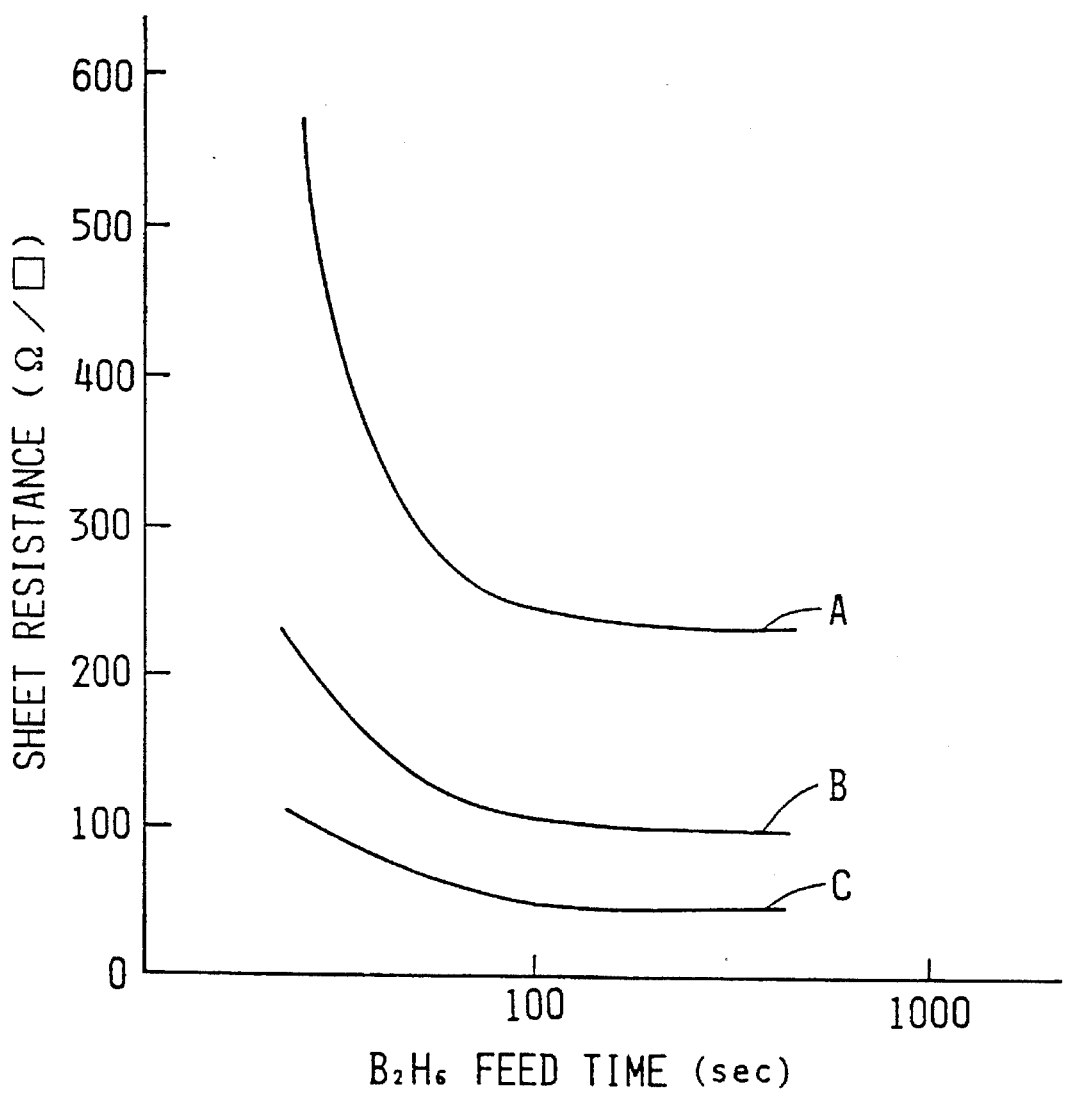
FIG. 6 is a diagram showing the diborane feed-time dependency of the sheet resistance of the silicon wafer.

FIG. 6 shows the diborane feed time dependency and the diffusion temperature dependency of the sheet resistance of a silicon wafer after passing through the process for diffusing boron into the silicon wafer and activating boron. Line A shows the sheet resistance in case the heat treatment in the process of diffusion is performed at 850° C. for 1 hour. Line B shows the sheet resistance in case the heat treatment in the process of diffusion is performed at 900° C. for 1 hour. Line C shows the sheet resistance in case the heat treatment in the process of diffusion is performed at 950° C. for 1 hour. The silicon wafer is doped with boron under the same conditions as those of the embodiment of FIGS. 3 except for the gas feed time and the boron diffusion temperature. The diborane feed time for the embodiment in FIGS. 3 is 200 sec. FIG. 6 shows that the ratio of the change of the sheet resistance of the impurity diffusion layer to the change of the feed time of diborane increase in the area having a short feed time of gas and decreases in the area having a long feed time of gas from the line showing the feed time of diborane of approx. 80 sec. It is found that there is an area where the sheet resistance hardly depends on the feed time of gas. Therefore, uniform doping is realized by setting the feed time of diborane to 80 sec or more in the process for feeding diborane which is an impurity compound gas to the surface of the silicon wafer in FIG. 3(b) to form a layer of boron or a layer containing boron.

Figure 11A:
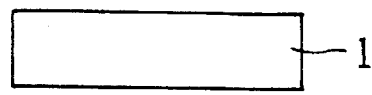
FIGS. 11(a)–11(e) are simplified pictorial views showing successive steps of a second embodiment of a doping method according to the present invention.
Figure 11B:
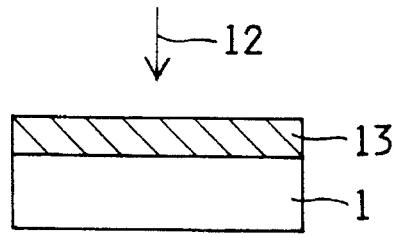
Figure 11C:
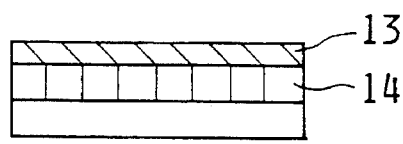
Figure 11D:
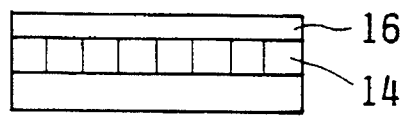
Figure 11E:
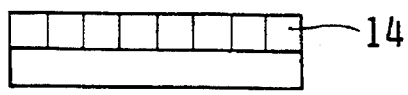

FIGS. 11(a) through (e) show a sequence of process steps for oxidizing the layer 13 of boron or a compound containing boron, and removing after doping. FIGS. 11(a) through (c) show a step sequence similar to FIGS. (a) through (c) in the impurity doping method according to the present invention. FIG. 11(d) shows a step for oxidizing the layer 13 of boron or a compound containing boron. In this step, wet oxidation or dry oxidation is performed at a relatively low temperature of 500° to 800° C. Since the step is an oxidation at low temperature, the diffusion layer of boron 14 is hardly oxidized and the diffusion distribution is not changed. As a result, the layer 13 of boron or a compound containing boron can be selectively oxidized. Especially, when the layer 13 is oxidized at 600° C., the selecting ratio is high. Further, it is possible to oxidize the layer 13 with $HNO_3$. It is more desirable to use heated $HNO_3$, because the oxidation rate would increase. FIG. 11(e) shows a step for removing the boron oxide layer 16 by a HF treatment.

Figure 12A:
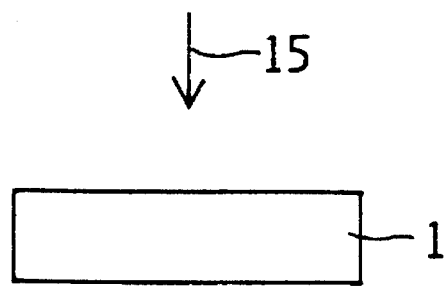
FIGS. 12(a)–12(d) are simplified pictorial views showing successive steps of a third embodiment of a doping method according to the present invention.
Figure 12B:
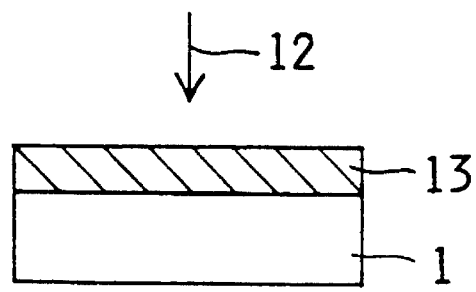
Figure 12C:
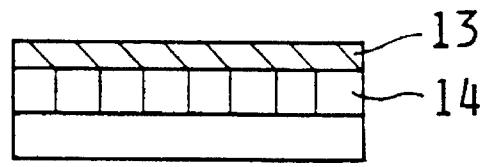
Figure 12D:
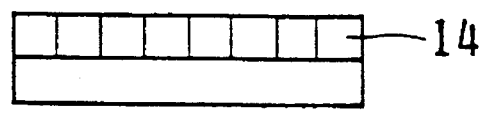

FIGS. 12(a) through (d) show a sequence of process steps for removing the layer 13 of boron or a compound containing boron by the wet etching or dry etching after doping. FIGS. 12(a) through (c) show steps similar to those of FIGS. 3(a) through (c). FIG. 12(d) shows a step for removing the layer 13 of boron or a compound containing boron by wet etching or dry etching. For wet etching, a mixed liquor of HF and $HNO_3$ is used. In case the layer 13 is a 100% boron layer, it is possible to remove the layer 13 with $HNO_3$. For dry etching, a gas comprising fluorine or chlorine is used.

As described above, a uniform sheet resistance can be obtained by uniformly doping all areas of all wafers with boron. Thus, it is possible to set the amount of boron to be diffused into a silicon wafer and the sheet resistance thereof to a desired value by controlling the temperature and time for heat treatment in the process described with reference to FIG. 3(c). The area in which the ratio of the change of sheet resistance of the impurity diffusion layer to the change of the feed amount of compound gas containing an impurity is small depends on the type of the compound gas containing the impurity, the type of the semiconductor wafer, the wafer temperature with the compound gas supplied, and the temperature and time for diffusion from the impurity diffusion source. Therefore, all areas to be doped of all wafers can be uniformly doped with the impurity and a uniform sheet resistance can be obtained by feeding the compound gas containing the impurity on the condition that the feed amount of the compound gas to all areas of all wafers is within a range suitable for each condition.

Thus, uniform impurity doping is realized by the process shown in FIGS. 3. When the impurity diffusion source left on the surface of the silicon wafer is unnecessary after the process in FIG. 3(c), the layer can be removed by etching it with hydrofluoric acid after executing wet oxidation at a relatively low temperature of 600° to 800° C.

As described above, the present invention has the characteristic that the feed amount of the compound gas containing the impurity in all areas to be doped of all wafers is set in the range in which the ratio of the change of the sheet resistance of the impurity diffusion layer to the change of the feed amount of the compound gas containing impurity is small. Therefore, uniform doping is realized when doping many wafers or doping one wafer with a diameter larger than the distance between a gas feed nozzle and the wafer.

This application relates to subject matter disclosed in Japanese Application numbers 3-63323, filed on Mar. 27, 1991 and 3-113544, filed on May 17, 1991, the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A method for doping a region below a surface of a semiconductor substrate with an impurity comprising: removing any inert film from the semiconductor surface; applying to the semiconductor surface a gas containing impurity atoms to form a layer containing the impurity atoms with an impurity concentration; and effecting diffusion into the region below the surface of the semiconductor substrate using the layer as an impurity diffusion source and effecting activation of the impurity; wherein said step of applying is carried out in a manner to keep the impurity concentration at the semiconductor surface at least equal to the solid solubility until completion of said steps of effecting diffusion and effecting activation.

2. A method according to claim 1 wherein the feed pressure with which the gas is applied to the semiconductor surface is at least $2 \times 10^{-5}$ Torr.

3. A method according to claim 1 wherein said step of applying is carried out by feeding the gas to the semiconductor surface during a feed time selected to cause the region into which diffusion is effected to have a sheet resistance value which is substantially independent of variations in the feed time.

4. A method according to claim 3 wherein said step of applying is carried out by feeding the gas to the semiconductor surface in an amount selected to cause the region into which diffusion is effected to have a sheet resistance value which is substantially independent of variations in the feed amount.

5. A method according to claim 1 wherein said step of applying is carried out by feeding the gas to the semiconductor surface in an amount selected to cause the region into which diffusion is effected to have a sheet resistance value which is substantially independent of variations in the feed amount.

6. A method for doping a region below a surface of a semiconductor substrate with an impurity comprising: removing any inert film from the semiconductor surface; applying to the semiconductor surface a gas containing impurity atoms to form a layer containing the impurity atoms with an impurity concentration; and effecting diffusion into the region below the surface of the semiconductor substrate using the layer as an impurity diffusion source and effecting activation of the impurity; wherein said step of applying is carried out in a manner to keep the impurity concentration at the semiconductor surface at least equal to the solid solubility until completion of said steps of effecting diffusion and effecting activation.

7. A method according to claim 6 wherein the feed time during which the gas is applied to the semiconductor surface is at least 80 sec.

8. A method for doping a region below a surface of a semiconductor substrate with an impurity comprising: removing any inert film from the semiconductor surface; applying to the semiconductor surface a gas containing impurity atoms to form a layer containing the impurity atoms with an impurity concentration; and effecting diffusion into the region below the surface of the semiconductor substrate using the layer as an impurity diffusion source and effecting activation of the impurity; wherein said step of applying is carried out in a manner to keep the impurity concentration at the semiconductor surface at least equal to the solid solubility until completion of said steps of effecting diffusion and effecting activation.

9. A method according to claim 8 wherein the feed amount of the gas applied to the semiconductor surface is at least $4 \times 10^{-3}$ Torr. sec.

10. A method for doping a region below a surface of a semiconductor substrate with an impurity comprising: removing any inert film from the semiconductor surface; applying to the semiconductor surface a gas containing impurity atoms to form a layer containing the impurity atoms; effecting diffusion into the region below the surface of the semiconductor substrate using the adsorption layer as an impurity diffusion source and effecting activation of the impurity; wherein the layer remains on the semiconductor surface after said step of effecting diffusion and effecting activation; and effecting selective oxidation of the remaining layer at a temperature between about 500° C. and 800° C.

* * * * *